(12) United States Patent
Cheng et al.

(10) Patent No.: US 7,555,416 B2
(45) Date of Patent: Jun. 30, 2009

(54) EFFICIENT TRANSISTOR-LEVEL CIRCUIT SIMULATION

(75) Inventors: Chung-Kuan Cheng, San Diego, CA (US); Zhengyong Zhu, Sunnyvale, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/777,211

(22) Filed: Jul. 12, 2007

(65) Prior Publication Data

US 2008/0010048 A1   Jan. 10, 2008

Related U.S. Application Data

(63) Continuation of application No. PCT/US2005/020369, filed on Jun. 8, 2005.

(60) Provisional application No. 60/644,244, filed on Jan. 14, 2005.

(51) Int. Cl.
*G06F 17/50* (2006.01)

(52) U.S. Cl. .............................. 703/14; 703/2; 703/15; 716/4; 716/6

(58) Field of Classification Search .................. 703/14, 703/2, 15; 716/4, 6; 713/500; 333/214; 257/393; 76/4, 6
See application file for complete search history.

(56) References Cited

U.S. PATENT DOCUMENTS

| | | | | |
|---|---|---|---|---|
| 5,313,398 A | * | 5/1994 | Rohrer et al. ................. 703/14 |
| 5,379,231 A | * | 1/1995 | Pillage et al. ................. 703/14 |
| 5,467,291 A | * | 11/1995 | Fan et al. ...................... 703/14 |
| 5,694,052 A | | 12/1997 | Sawai et al. | |
| 5,790,415 A | * | 8/1998 | Pullela et al. .................. 716/6 |
| 5,888,875 A | | 3/1999 | Lasky | |
| 6,141,676 A | | 10/2000 | Ramirez-Angulo et al. | |
| 6,308,300 B1 | | 10/2001 | Bushnell et al. | |
| 6,557,148 B1 | | 4/2003 | Nishida et al. | |
| 6,577,992 B1 | | 6/2003 | Tcherniaev et al. | |
| 6,662,149 B1 | | 12/2003 | Devgan et al. | |
| 6,665,849 B2 | | 12/2003 | Meuris et al. | |
| 2002/0131135 A1 | | 9/2002 | Chow et al. | |
| 2003/0065965 A1 | * | 4/2003 | Korobkov ..................... 713/500 |
| 2003/0075765 A1 | * | 4/2003 | Ohnakado et al. ............ 257/393 |
| 2003/0200071 A1 | * | 10/2003 | Zhang et al. .................. 703/15 |

(Continued)

FOREIGN PATENT DOCUMENTS

WO   WO 2004/109452   12/2004

(Continued)

OTHER PUBLICATIONS

Beattie, M., et al., "IC Analyses Including Extracted Inductance Models" Proceeding of the 36th ACM/IEEE conference on Design automation. pp. 915-920. Jun. 21-25, 1999 (6 pages). New Orleans, Louisiana.

(Continued)

*Primary Examiner*—Paul L Rodriguez
*Assistant Examiner*—Kandasamy Thangavelu
(74) *Attorney, Agent, or Firm*—Fish & Richardson P.C.

(57) ABSTRACT

Techniques are described for performing analysis of circuits with nonlinear circuit components such as transistors based on a two-stage Newton-Raphson approach.

21 Claims, 10 Drawing Sheets

U.S. PATENT DOCUMENTS

| | | | |
|---|---|---|---|
| 2003/0204828 A1* | 10/2003 | Iwanishi | 716/6 |
| 2004/0008096 A1* | 1/2004 | Liu et al. | 333/214 |
| 2004/0044510 A1* | 3/2004 | Zolotov et al. | 703/14 |
| 2005/0076318 A1* | 4/2005 | Croix et al. | 716/4 |
| 2005/0096888 A1* | 5/2005 | Ismail | 703/2 |
| 2005/0102124 A1* | 5/2005 | Root et al. | 703/14 |

FOREIGN PATENT DOCUMENTS

| | | |
|---|---|---|
| WO | WO 2007/005005 | 1/2007 |

OTHER PUBLICATIONS

Chen, T., et al., "Efficient Large-Scale Power Grid Analysis Based on Preconditioned Krylov-Subspace Iterative Methods," IEEE/ACM Design Automation Conference, University of Wisconsin-Madison, pp. 559-562, 2001.

David Blaauw, Rajendran Panda, and Rajat Chaudhry, "Design and Analysis of Power Distribution Networks," *Design of high-performance microprocessor circuits*, Chapter 24, pp. 499-521, IEEE Press 2001 by the Institute of Electrical and Electronics Engineers, Inc., 3 Park Avenue, 17th Floor, New York, NY.

De Geus, A.J., "SPECS: simulation program for electronic circuits and systems." In Proceedings of the International Symposium on Circuits and Systems, pp. 534-537, pp. 10-16, 1984. Queen Elizabeth Hotel, Montreal, Canada.

Devgan, A. and Rohrer, R. A., "Adaptively Controlled Explicit Simulation." IEEE Transactions on Computer-Aided Design of ICs and Systems, vol. CAD-13(6), pp. 746-762. Jun. 1994.

Devgan, A., et al., "How to Efficiently Capture On-Chip Inductance Effect: Introducing a New Circuit Element K," Proc. ICCAD 2000, pp. 150-155, (Nov. 2000).

Feldmann, P., and Freund, R. W., "Reduced-order modeling of large linear subcircuits via a block Lanczos algorithm," Proceedings of 32nd DAC, pp. 474-479, 1995. San Francisco, California. ISBN:0-89791-725-1.

Gala, K., et al., On Chip Inductance Modeling and Analysis, DAC, Jun. 2000, pp. 63-68 Inductance Models, DAC, Los Angeles, California.

He, L., et al., An Efficient Inductance Modeling for Onchip Interconnects, CICC, May 1999, pp. 457-460. Town and Country Hotel, San Diego, California.

Kerns, K.J., et al., "Stable and efficient reduction of substrate model networks using congruence transforms," Proceedings of ICCAD, pp. 207-214, 1995. San Jose, California.

Kozhaya, , J.N., et al., "Multigrid-like Technique for Power Grid Analysis," Proc. ICCAD 2001, pp. 480-487, San Jose, California.

Lelarasmee, E., et al., "The Waveform relaxation method for the time-domain analysis of large scale integrated circuits." IEEE Transactions on Computer-Aided Design of ICs and Systems, vol. CAD-1(3), pp. 131-145, Jul. 1982.

Li, Z., and Shi, C. J., SILCA: Fast-Yet-Accurate Time-Domain Simulation of VLSI Circuits with Strong Parasitic Coupling Effects, pp. 793-799, ICCAD 2003. San Jose, California.

Lin, S., and E.S. Kuh, "transient simulation of lossy interconnects based on the recursive convolution formulation," IEEE Transactions on CAS I: Fundamental Theory and Applications, vol. 39, pp. 879-892, Nov. 1992.

Lin, S., et al., "Stepwise equivalent conductance circuit simulation." IEEE Transactions on Computer-Aided Design of ICs and Systems, vol. CAD-12(5), pp. 672-683, May 1993.

Nassif, S.R., et al., "Fast Power Grid Simulation," Proceeding of DAC, pp. 156-161, 2000.

Newton, A.R., et al., "Relaxation based electrical simulation." IEEE Transactions on Computer-Aided Designs of ICs and Systems, vol. CAD-3(4), pp. 308-330, Oct. 1984.

Odabasioglu, A., et al., "PRIMA: Passive Reduced-Order Interconncet Macromodeling Algorithm", Proc. ACM/IEEE ICCAD Nov. 1997, pp. 58-65, San Jose, California.

Phillips, J.R., et al., "Guaranteed passive balancing transformations for model order reduction," Proceedings of 39th DAC, pp. 52-57, 2002.

Raghavan, V., et al., "A WESpice: A general tool for the accurate and efficient simulation of interconnect problems," Proceedings of the 29th ACM/IEEE conference on Design automation, pp. 87-92, Jun. 8-12, 1992. Ahaheim, California.

Sakallah, K. A., et al., "SAMSON2: an event driven VLSI circuit simulator." IEEE Transaction s on Computer-Aided Design of ICs and Systems, vol. 4(4), pp. 668-684, Oct. 1985.

Visweswariah, C., and Rohrer, R. A., "Piecewise Approximate Circuit Simulation." IEEE Transactions on Computer-Aided Design of ICs and Systems, vol. CAD-10(7), pp. 861-870, Jul. 1991.

White, J., et al., "RELAX2: a new waveform relaxation approach for the analysis of LSI MOS circuits." In Proceedings of the International Symposium on Circuits and Systems (ISCAS), pp. 756-759, vol. 2. May 1983, Newport Beach, California.

Zhu, Z. and Cheng, C.K., Power Network Analysis Using and Adaptive Algebraic Multigrid Approach, ACM/IEEE Design Automation Conference, pp. 105-108, Jun. 2003. Anaheim, California.

International Search Report and Written Opinion dated Jun. 2, 2006, for PCT/US05/20369, international filing date Jun. 8, 2005 (9 pages).

Acar et al., "TETA: Transistor Level Waveform Evaluation for Timing Analysis," IEEE Trans. On Computer-Aided Design, vol. 21, No. 5, (May 2002).

Afshari, E., et al., "Non-Linear Transmission Lines for Pulse Shaping In Silicon," Proc. of IEEE Custom Integrated Circuits Conference, pp. 91-94, Sep. 2003.

Backhouse et al., "WSix Thin Film for Resistors," Thin Solid Films, vol. 311, No. 1-2, pp. 299-303 (1997).

Backmann, B.M., et al., "TLC: Transmission Line Caches," Proceedings of the 36th IEEE International Symposium on Microarchitecture (Micro-36'03), 12 pages (2003).

Black, J.R., "Electromigration Failure Modes in Aluminum Metalization for Semiconductor Devices," Proc. IEEE, pp. 1587-1594, (2003).

Bobba et al., "IC power distribution challenges," IEEE/ACM International Conference on Computer Aided Design, pp. 643-650, (2001).

Brandt, A., "A Multi-level adaptive solutions to boundary value problems," Math. Comput., 31:333-390 (1977).

Cao et al., "HiPRIME: Hierarchical and Passivity Reserved Interconnect Macromodeling Engine for RLKC Power Delivery," IEEE/ACM Design Automation Conference, pp. 379-384, (2002).

Chang et al, "RF/Wireless Interconnect for Inter- and Intra-Chip Communications," Proceedings of the IEEE, vol. 89, No. 4, pp. 456-466 (2001).

Chang et al., "Near Speed-of-Light Signaling Over On-Chip Electrical Interconnects," IEEE Journal of Solid-State Circuits, vol. 38, No. 5, pp. 834-838 (2003).

Chen, H., et al., "Interconnect and circuit modeling techniques for full-chip power supply noise analysis," IEEE Transactions on Components, Packaging, and Manufactured Technology, Part B, vol. 21, No. 3, pp. 209-215, Aug. 1998.

Chen, H., et al., "Surfliner: a distortionless electrical signaling scheme for speed of light on-chip communications," Proceedings of the 2005 International Conference on Computer Design (ICCD '05), 6 pages, (2005).

Dally et al, "High-Performance Electrical Signaling," IEEE Integrated Conference on Massively Parallel Processing Using Optical Interconnections, 6 pages, Jun. 1998.

Dally, W., " More about Wires Lossy Wires, Multi-Drop Buses, and Balanced Lines," EE273 Lecture 3 (10 pages). Sep. 30, 1998, Computer Systems Laboratory, Stanford University.

Ho et al., "The Future of Wires," Proc. of IEEE, vol. 89, No. 4, pp. 490-504 (Apr. 2001).

Ho, R., et al., "Efficient On-Chip Global Interconnectors," 2003 Symposium on VLSI Circuits Digest of Technical Papers, pp. 271-274, Jun. 2003.

Jokerst et al, "The Heterogeneous Integration of Optical Interconnections Into Integrated Microsystems," IEEE Journal of Selected Topics in Quantum Electronics, vol. 9, No. 2, pp. 350-360 (Mar./Apr. 2003).

Katopis, G.A., "Delta-I Noise Specification for a High-performance Computing Machine," Proc. of the IEEE, vol. 73, pp. 1450-1415, (1985). [Meditech, "Correction to: Katopis, G.A., 'Delta-I Noise Specification for a High-performance Computing Machine,'Proc. of the IEEE, vol. 73, pp. 1450-1415, (1985)," Proceedings of the IEEE 70(12): 1864 (Dec. 1985) attached following Katopis article].

Kozhaya et al., "A multigrid-like technique for power grid analysis," IEEE Transactions on Computer-Aided Design of Integrated Circuits, vol. 21, Issue 10, pp. 1148-1160, Oct. 2002.

Krauter, B., et al., "Generating Sparse Partial Inductance Matrices with Guaranteed Stability," Proceedings of the 1995 IEEE/ACM international conference on Computer-aided design. San Jose, California, pp. 45-52 (1995).

Kuhn et al., "Integration of Mixed-Signal Elements into a High-Performance Digital CMOS Process," Intel Technology Journal, vol. 6, Issue 2, pp. 31-42 (May 16, 2002).

La Scala et al., "A relaxation type multigrid parallel algorithm for power system transient stability analysis," IEEE International Symposium on Circuits and Systems, May 8-11, 1989. Portland, Oregon, vol. 3, pp. 1954-1957.

La Scala, M., et al., "Relaxation/Newton methods for concurrent time step solution of differential-algebraic equations in power system dynamic simulations," IEEE Transactions on Circuits and Systems 1: Fundamental Theory and Applications, vol. 40, Issue 5, pp. 317-330, (May 1993).

Lahaye, D., et al., "Algebraic Multigrid for Complex Symmetric Systems," IEEE Transactions on Magnetics, 36(4): 1535-1538, Jul. 2000. Published by IEEE Service Center, New York, NY, USA.

Lee, Y., et al., "Power Grid-Transient Simulation in Linear Time Based on Transmission-Line-Modeling Alternating-Direction-Implicit Method," IEEE/ACM International Conference on Computer Aided Design, pp. 75-80, (2001).

Lee, Y.M., et al., "The power grid transient simulation in linear time on 3D alternating-direction-implicit method," Proceedings of the Design, Automation and Test in Europe Conference and Exhibition. pp. 1020-1025, (2003).

Lin, S., et al., "Challenges in Power-Ground Integrity," IEEE/ACM International Conference on Computer Aided Design, pp. 651-654, (2001).

Maheshwari, A., et al., "Differential Current-Sensing for On Chip Interconnects," IEEE Transactions on Very Large Scale Integration (VLSI) Systems, vol. 12, No. 12, pp. 1321-1329 (Dec. 2004).

Namiki, T., et al., "New FDTD algorithm free from the CFL condition restraint for a 2D-TE wave," IEEE Antennas Progagat. Symp. Dig., pp. 192-195, (Jul. 1999).

Nassif, S.R., et al., "Multigrid methods for power grid simulation," The 2000 IEEE International Symposium on Circuits and Systems, 2000. May 28-31, 2000. Geneva, Switzerland, vol. 5, pp. 457-460 (2000).

Stojanovic, V. et al., "Adaptive Equalization and Data Recovery in a Dual Mode (PAM2/4) Serial Link Transceiver," 2004 Symposium on VLSI Circuits Digest of Technical Papers, pp. 348-351 (2004).

Stuben, K., "A review of algebraic multigrid," Journal of Computational and Applied Mathematics, vol. 128 (No. 1-2), pp. 281-309 (Mar. 1, 2001). Published in Netherlands.

Stuben, K., "Algebraic Multigrid (AMG): An Introduction with Applications," GMD Report No. 70 (Nov. 1999), 127 pages.

Taylor, S., "The Challenge of Designing Global Signals in UDSM CMOS," IEEE Custom Integrated Circuits Conference, San Diego, CA, pp. 429-235, (1999).

Wachspress, et al., "An alternating-direction implicit iteration technique," J. Soc. Ind. and Appl. Match 8: 403-424 (1960).

Wang, K., et al., "Power/ground mesh area optimization using multigrid-based techniques [IC design]," Design, Automation and Test in Europe Conferences and Exhibition, 2003, Santa Barbara, CA, pp. 850-855 (Mar. 3-7, 2003).

Zhao et al., "Frequency domain analysis of switching noise on power supply network," IEEE/ACM International Conference on Computer Aided Design, pp. 487-492, (2000).

Zhao et al., "Hierarchical analysis of power distribution networks," IEEE Transactions on Computer-Aided Design of Integrated Circuits and Systems, vol. 21, No. 2, pp. 159-168, (Feb. 2002).

Zheng et al., "Toward the development of a three-dimensional unconditionally stable finite-difference time domain method," IEEE Tran. Microwave Theory and Techniques, vol. 48, No. 9, (9 pages). Sep. 2000.

Zhu, et al., "Efficient Transient Simulation for Transistor-Level Analysis," EDA Technofair Design Automation Conference Asia and South Pacific Proceedings of the 2005 Conference on Asia South Pacific Design Automation, Shanghai, China (2005) pp. 240-243, published by the ACM, New York, NY, USA.

* cited by examiner

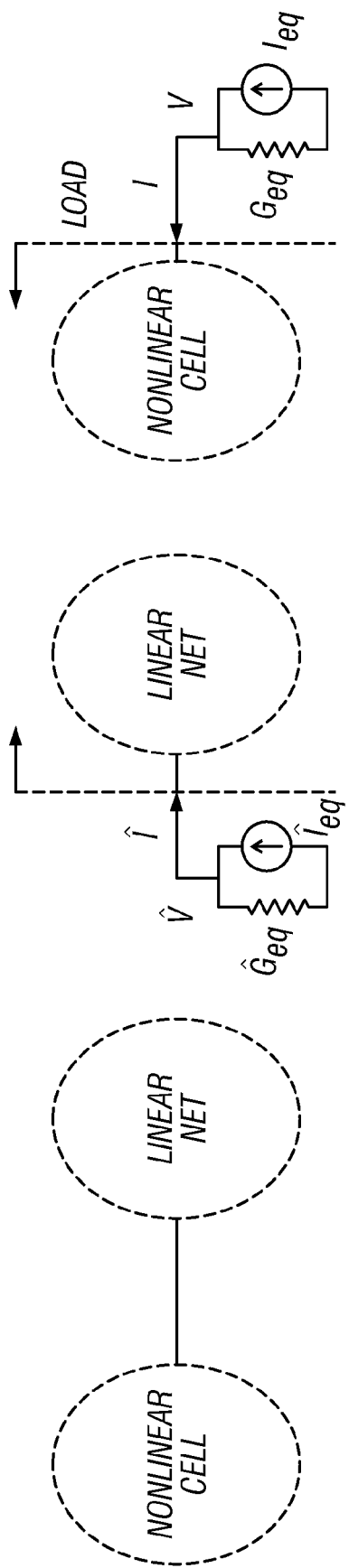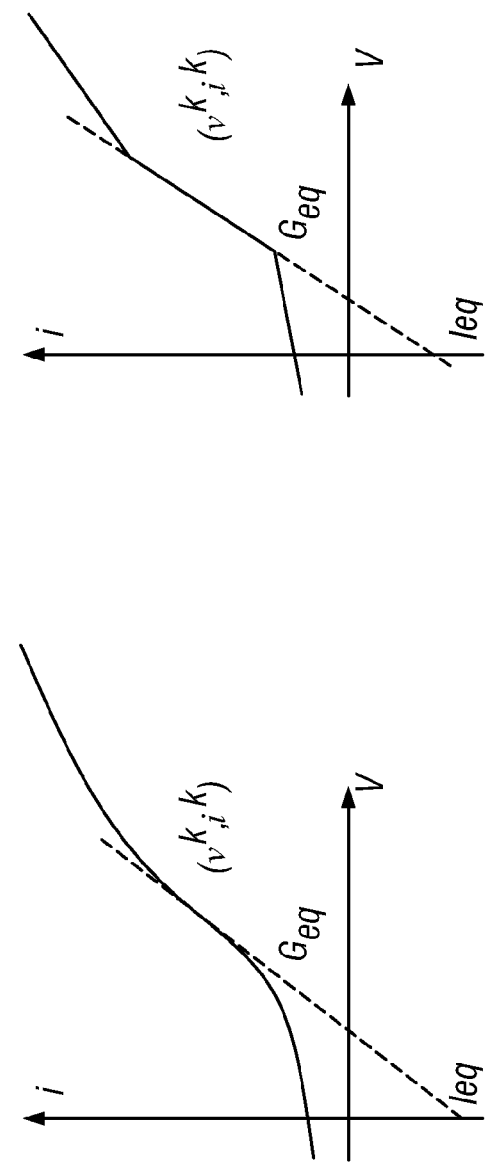
FIG. 1A
FIG. 1B
FIG. 1C
FIG. 1D
FIG. 1E

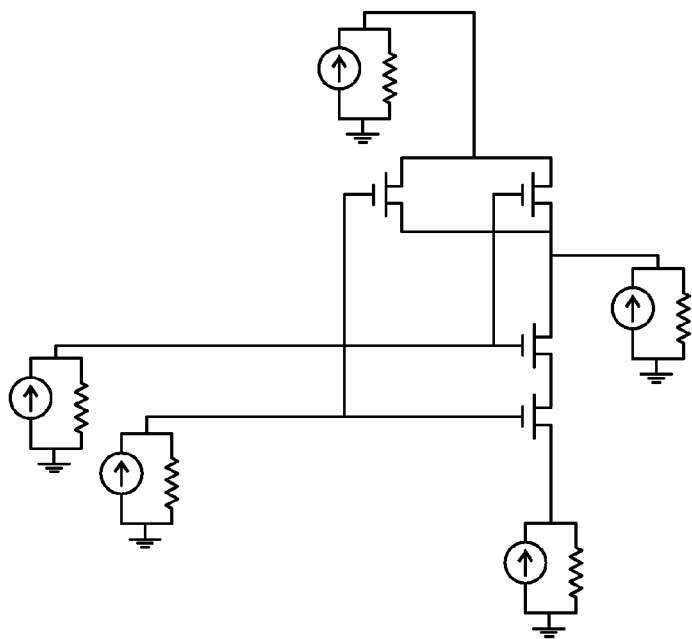
FIG. 2C
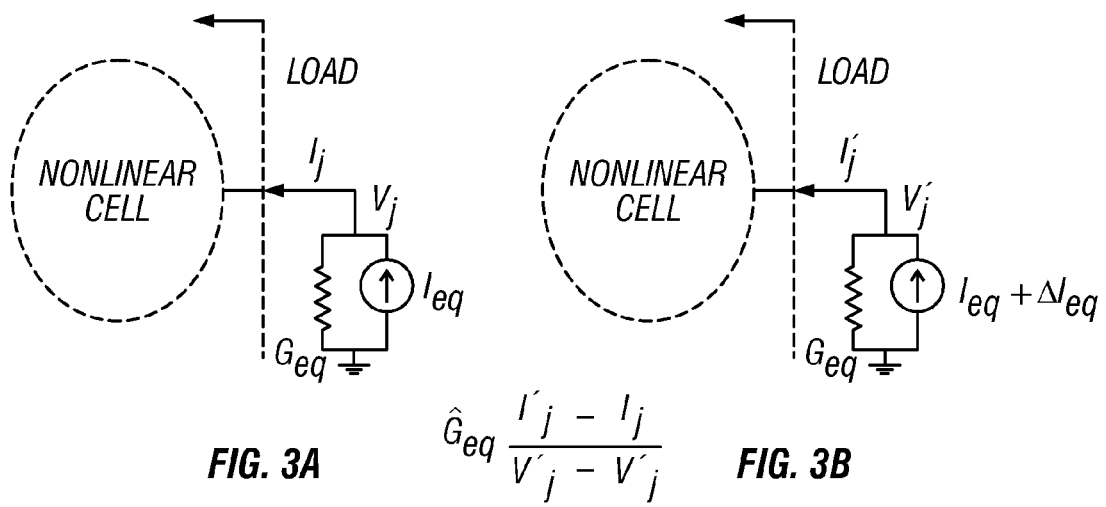
FIG. 3A   FIG. 3B

$$\begin{cases} \hat{V}_1 = (I_{eq} + \hat{I}_1)/G_{eq} \\ \hat{V}_2 = (I_{eq} + \hat{I}_2)/G_{eq} \end{cases} \Longrightarrow \begin{cases} G_{eq} = \dfrac{\hat{I}_2 - \hat{I}_1}{\hat{V}_2 - \hat{V}_1} \\ I_{eq} = G_{eq}\hat{V}_2 - \hat{I}_2 \end{cases}$$

EFFICIENT TRANSISTOR-LEVEL CIRCUIT SIMULATION

CROSS REFERENCE TO RELATED APPLICATIONS

This application is a continuation of and claims priority under 35 U.S.C. §120 to pending PCT Application No. PCT/US05/20369 designating the U.S. and filed on Jun. 8, 2005, which claims priority under 35 U.S.C. §119(e)(1) from U.S. Provisional Patent Application No. 60/644,244, entitled "EFFICIENT TRANSISTOR LEVEL SIMULATION USING TWO-STAGE NEWTON-RAPHSON AND MULTIGRID METHOD" and filed on Jan. 14, 2005. Both applications are incorporated herein by reference in their entirety.

STATEMENT AS TO FEDERALLY SPONSORED RESEARCH

This invention was made with government support under Grant No. CCR-9987678 awarded by the National Science Foundation. The government has certain rights in the invention.

BACKGROUND

This application relates to analysis of integrated circuits.

Circuits may be viewed as networks of nodes and circuit components connected between nodes. As such, circuits may be analyzed based on a nodal analysis where a nodal equation may be written for each node based on the conservation of charge at the node, i.e., the total current entering the node is equal to the total current leaving the node (the Kirchoff's second rule). For a circuit with N nodes, N equations for the N nodes can be expressed in terms of the properties of circuit components such as resistance, capacitance, and inductance, and in terms of the node voltages and currents. These N equations can be written into a matrix equation and are solved using various matrix approaches such as LU decompositions of matrices. For circuits with certain control sources, inductance and current control sources, additional equations for different current branches may be added to fully describe the circuits.

Power network analysis may be performed based on the circuit matrix equations to investigate behaviors of circuit networks such as voltage drop, voltage oscillation, and electromigration. Excessive voltage drops may reduce the switching speed as well as the noise margins of circuits and may even cause logic failures under some circumstances. Electromigration may decrease the chip lifetime. Moreover voltage oscillation may occur when power network resonance frequency drops to the range of the signal frequency.

One bottleneck of the power network analysis based on the above nodal analysis is the tremendous amount of variables in large power networks such as integrated circuits. One well-known circuit analysis software program for solving such circuit equations is the SPICE circuit simulator originally developed by the University of California at Berkeley. The SPICE uses the LU decomposition of a matrix to solve the circuit equations. As the number of the circuit elements and nodes increases, the super linear complexity of the LU deposition method and other direct methods make them prohibitive for large-scale circuits.

The power networks are mostly linear circuit networks. There are other more complex circuits such as circuits with transistors which exhibit nonlinear circuit properties. Matrices for circuits with transistors may be solved by, e.g., direct simulation methods like LU decomposition used in the Berkeley SPICE2 simulator and its variations. See, Nagal, "Spice2: A computer program to simulate semiconductor circuits," Tech. Rep. ERL M520, Electronics Research Laboratory Report, UC Berkeley (1975). The direct simulation methods may become less effective and can reach their computational limits when the number of transistors in circuit networks increases and the circuit configurations become complex. This is in part because the super linear complexity $O(n^{1.5})$ increases with the number of circuit nodes, n, and the amount of the extracted interconnect data for a large n can exceed the capacity of the software based on a direct simulation method.

Various other transistor-level simulation methods have been developed to address the limitations of the direct simulation methods, some of which, however, have trade-offs in certain aspects such as the simulation accuracy in comparison with the direct simulation methods. Examples of other transistor-level simulation methods include application of different integration methods (explicit or implicit) on subcircuits according to their activities by Sakallah and Director in "SAMSON2: An event driven VLSI circuit simulator," IEEE Trans. On Computer-Aided Design ICs and Systems, Vol. 4(4), pp. 668-684 (1985), and reduction of the number and cost of LU decompositions by using low cost integration approximation and simpler linearization via successive C=chord method) by Li and Shi in "SILCA: Fast-yet-accurate time-domain simulation of VLSI circuits with strong parasitic coupling effects," ICCAD, pp. 793-799 (2003). Various fast simulation tools for transistor-level simulation are also commercially available from companies such as Nassda Corporation (www.nassda.com), Synopsys, Inc.(www.synopsys.com), Apache Design Solutions, Inc. (www.apachedesignsolutions.com) and Cadence Design Systems (www.cadence.com). These commercial simulation software tools usually partition a circuit into subcircuits which can be simulated with different time steps to explore latency but can have potential convergence problems due to the coupling effects or strong feedback in the circuits. The convergence rate may also be sensitive to the partition algorithm and propagation order.

SUMMARY

This application describes, among others, transistor-level simulation techniques that are computationally efficient, provide assured convergence, and provide a high accuracy that is at least comparable to the accuracy of many direct simulation methods such as SPICE for simulating VLSI circuits with strong coupling effects (e.g., deep-submicron and nanometer VLSI circuits). In described implementations, an adaptive algebraic multigrid method for large networks of power/ground, clock and signal interconnects can be used to simulate the linear part of the circuit. Transistor devices in the circuit can be integrated using a two-stage Newton-Raphson method to dynamically model the linear network and nonlinear devices interface.

In one implementation, a method for analyzing a circuit network having transistors is described as follows. The circuit is represented by an equivalent circuit that comprises at least one linear network and at least one nonlinear cell to interface with each other. Circuit equations for the at least one linear network and the at least one nonlinear cell, respectively, are then solved. The solutions to the at least one linear network and the at least one nonlinear cell are matched at an interface between the at least one linear network and the at least one nonlinear cell. Accordingly, an article is also described to include at least one machine-readable medium that stores machine-executable instructions for the above method.

In another implementation, a method for analyzing a circuit network having transistors is described to represent a circuit by an equivalent circuit that comprises at least one linear network and at least one nonlinear cell to interface with each other. A Norton equivalent circuit is used to represent an interface between the at least one linear network and the at least one nonlinear cell. A Newton-Raphson iteration is applied to solve circuit equations for the at least one linear network and the at least one nonlinear cell. The solutions to the at least one linear network and the at least one nonlinear cell are matched at the interface between the at least one linear network and the at least one nonlinear cell.

Accordingly, an article is also described to include at least one machine-readable medium that stores machine-executable instructions for the above method. The instructions cause the machine to represent a circuit by an equivalent circuit that comprises at least one linear network and at least one nonlinear cell to interface with each other; use a Norton equivalent circuit to represent an interface between the at least one linear network and the at least one nonlinear cell; apply a Newton-Raphson iteration to solve circuit equations for the at least one linear network and the at least one nonlinear cell; and match solutions to the at least one linear network and the at least one nonlinear cell at the interface between the at least one linear network and the at least one nonlinear cell.

These and other implementations and variations are described in greater detail in the attached drawings, the detailed description, and the claims.

BRIEF DESCRIPTION OF DRAWINGS

FIGS. 1A, 1B, 1C, 1D and 1E show equivalent circuits and the circuit I-V responses for simulating an original circuit under the two-stage Newton-Raphson procedure.

FIGS. 2A, 2B and 2C show a specific example of the equivalent circuits based on the methods illustrated in FIGS. 1A, 1B and 1C.

FIGS. 3A, 3B, 4A and 4B show details of obtaining the equivalent Norton circuits for the nonlinear device interface and the linear network interface.

DETAILED DESCRIPTION

The circuit simulation techniques described here are designed to simulate circuits at the transistor level using a two-stage Newton-Raphson and multigrid method. The present techniques can be used to provide a fast, accurate transistor level simulation tool for full-chip simulation including power network and clock network analysis with SPICE-level accuracy and guaranteed convergence. This simulation tool can be used to analyze various circuit properties and behaviors, such as interconnect delay, crosstalk, voltage drop, ground bounce, and simultaneous switching. The two-stage Newton-Raphson method is designed to dynamically model the linear network and nonlinear devices boundary. A fast linear solver, such as an algebraic multigrid method, can be used to solve the coupled linear network. Mutual inductance in a circuit can be incorporated in the simulation without relying on error-prone matrix sparsification approximations or computation-intensive and time-consuming (i.e., computationally "expensive") matrix inversion.

Figure 1:
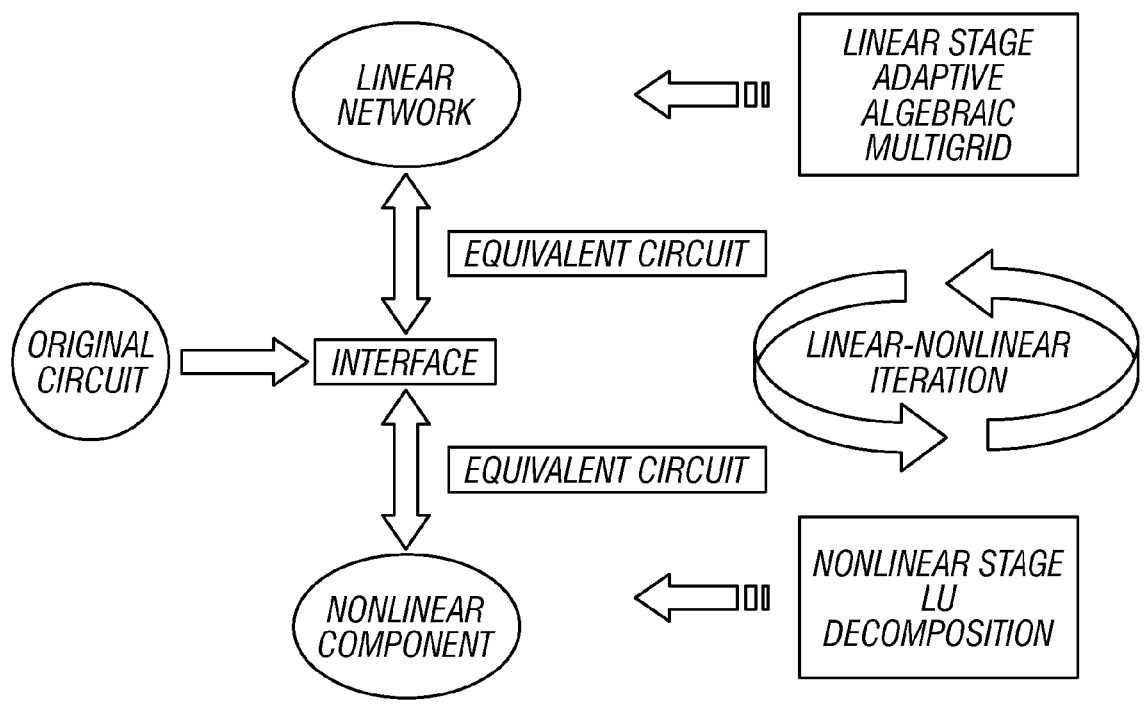
FIG. 1 is a block diagram showing one implementation of the present circuit simulation based on a two-stage Newton-Raphson procedure.

FIG. 1 illustrates one implementation of the present circuit simulation based on a two-stage Newton-Raphson procedure. The original circuit, which may be a circuit network with transistors (e.g., a VLSI circuit), is transformed into an equivalent circuit shown on the left hand side in FIG. 1 for the purpose of simulation. The equivalent circuit is partitioned into three modules for simulation: one or more equivalent linear networks that represent the linear portion of the original circuit, one or more equivalent nonlinear circuit cells that represent the nonlinear portion of the original circuit such as transistors, and one or more linear-nonlinear interfaces between the linear networks and the nonlinear circuit cells. The linear network is treated as a regular linear network by using a linear network circuit simulator. One example is an adaptive algebraic multigrid approach as disclosed in PCT application No. PCT/US04/17237 entitled "Circuit Network Analysis Using Algebraic Multigrid Approach" and filed on Jun. 1, 2004, which was published as PCT Publication No. WO2004109452A3 on Dec. 16, 2004. The entire disclosure of the PCT publication is incorporated herein by reference as part of the specification of this application. The nonlinear circuit cells are also treated by using a nonlinear LU decomposition. The interface is then solved to match the linear network and the nonlinear circuit cells via linear-nonlinear iterations as graphically represented in FIG. 1.

The above partitioning or decoupling of the nonlinear circuit devices and the linear networks of a given circuit is made inside the Newton-Raphson iteration and the linear-nonlinear interface is dynamically modeled via a two-stage Newton-Raphson procedure. The accurate modeling of the linear-nonlinear interface inside the Newton-Raphson iterations ensures the convergence of the simulation.

FIGS. 1A, 1B and 1C show graphic representation of the above simulation technique. FIG. 1A shows the equivalent circuit with a nonlinear cell and a linear network with an interface in the middle. Each linear-nonlinear interface is modeled as a Norton equivalent circuit, i.e., a circuit having a single current source characterized by an equivalent current Ieq and a load characterized by an equivalent conductance Geq. FIG. 1B shows that the nonlinear cell is treated as an equivalent Norton circuit coupled to the linear network. FIG. 1C shows that the linear network is treated as an equivalent Norton circuit coupled to the nonlinear cell. The equivalent Norton circuit for the linear network is different from the equivalent Norton circuit for the nonlinear cell and the differences are indicated by the circuit parameters: the branch current and nodal voltage at the interface, the current of the current source and the conductance of the load. In FIGS. 1A-1C, the equivalent conductance and equivalent current parameters are Geq and Geq, Ieq and Ieq, respectively. The parameters V, V, I and I are nodal voltages and branch currents, respectively.

Consider the interface boundary condition as an I-V function i=f(z), the Newton-Raphson concept can be used to model the interface. More specifically, a discrete Newton-Raphson method is implemented as shown in FIGS. 1A-1C and includes two stages: a nonlinear stage for nonlinear transistor devices and a linear stage for linear network. The interfaces are linearized as Norton equivalent circuits. After this linearization, the linear networks and nonlinear cells can be solved separately inside each Newton-Raphson iteration.

FIG. 1D illustrates an example of the I-V function at a linear-nonlinear interface. FIG. 1E shows an equivalent piecewise linearized curve that represents the I-V function in FIG. 1D. The linearized equation from the Newton-Raphson method is:

$$i = i^k + \frac{di}{dv}(v - v^k) \qquad (1)$$

The dynamic conductance and the equivalent current source can be obtained as below:

$$\begin{cases} G_{eq} = \frac{di}{dv}\bigg|k \\ I_{eq} = G_{eq}v^k - i^k \end{cases} \qquad (2)$$

The nonlinear devices have given nonlinear I-V functions and analytic $G_{eq}$ formulation. The I-V function f(v) at the interface boundary is unknown. According to the linearity property and the problem size of nonlinear cell and linear network, different discrete differential approximations are implemented for nonlinear cells and linear networks.

Figure 2A:
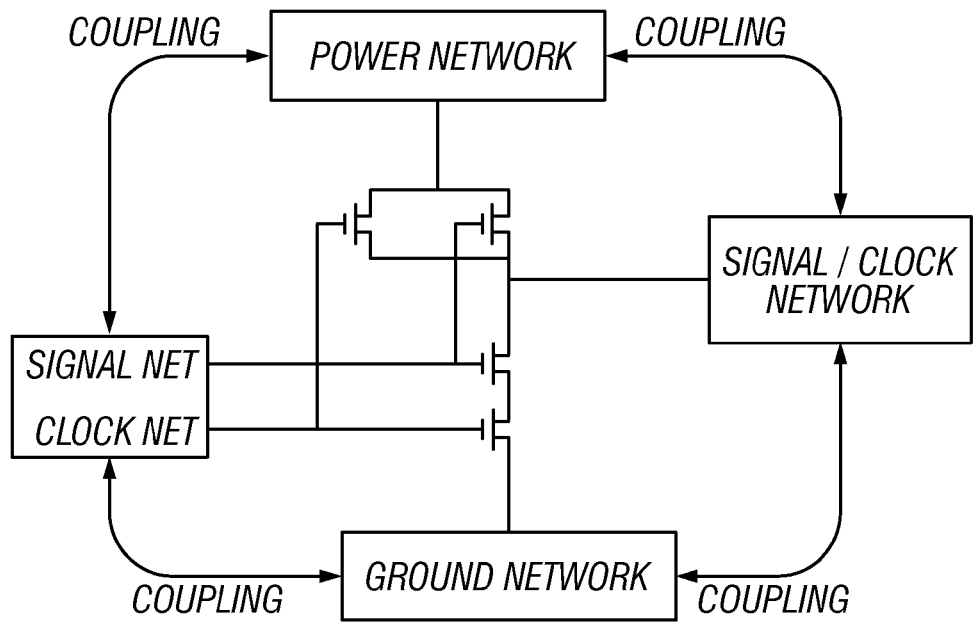
Figure 2B:
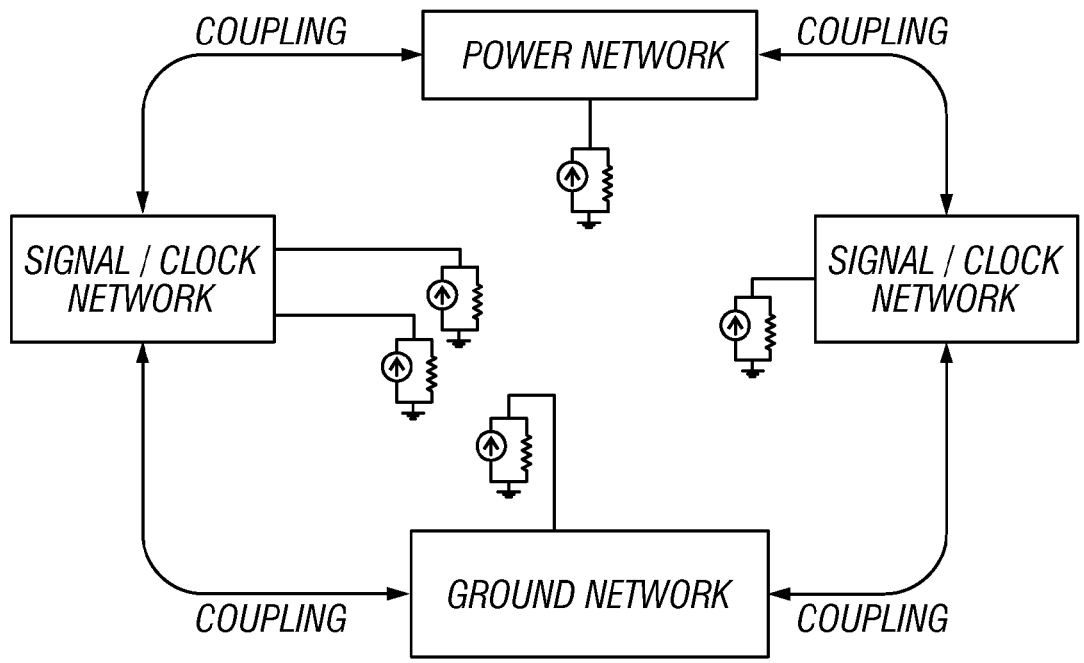

As an example, FIGS. 2A, 2B and 2C show the equivalent circuits in simulation of the an NAND gate. FIG. 2A shows the NAND gate circuit surrounded by coupled power, ground and signal networks. Decoupling and interface modeling of device and linear network are shown in FIGS. 2B and 2C for the equivalent nonlinear cells and linear network, respectively. Each connection with or to the NAND gate is simulated by a Norton equivalent circuit in FIGS. 2B and 2C. The transistor bulk nodes can also considered in the simulation.

Referring back to FIGS. 1A-1B, the details of obtaining the equivalent Norton circuits for the nonlinear device interface and the linear network interface are described below using equivalent circuits shown in FIGS. 3A, 3B, 4A and 4B.

FIGS. 3A and 3B illustrate the derivation of the Norton equivalent circuit of a nonlinear cell at port j. The load current $I_{eq}$ and conductance $G_{eq}$ are the Norton equivalent model of the neighboring linear network and are shown in FIG. 3A. Assuming the load current of port j is perturbed by an amount of $\Delta I_{eq}$ at the interface (FIG. 3B), the nodal voltage and branch current at port j will change accordingly due to this perturbation and can be derived from the solution of this nonlinear cell to provide the equivalent output conductance of the nonlinear cell, $$\hat{G}_{eq} = \frac{I'_j - I_j}{V'_j - V_j} \qquad (3)$$

$$v_j, v'_j, I_j, I'_j$$

where are nodal voltages and branch currents at port j with different load currents $I_{eq}$, and $I_{eq}+\Delta I_{eq}$.

Figure 4A:
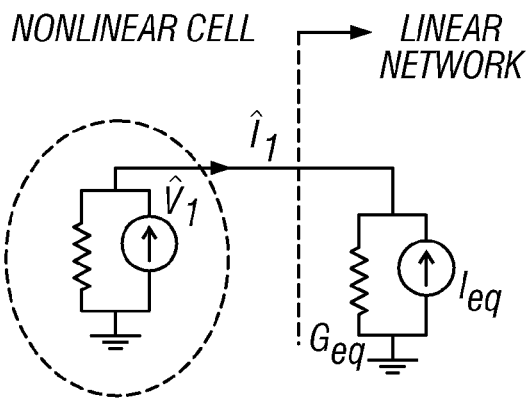
Figure 4B:
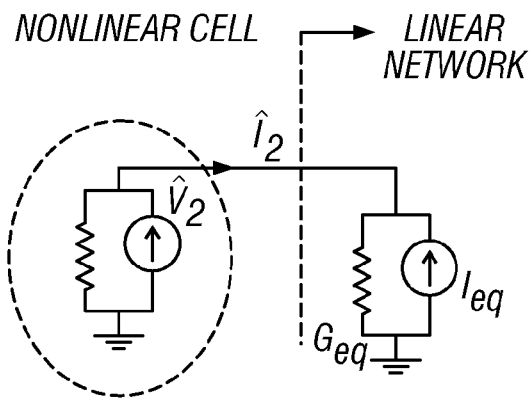

Similarly, the Norton equivalent model of the linear network at the interface can be constructed. FIGS. 4A and 4B illustrate the derivation of the Norton equivalent circuit of a linear network at the port j. Different from the solution for the nonlinear device interface, it is not efficient to solve the linear network repeatedly for each interface port because the number of nodes in linear network is usually large. Instead, a discrete approximation method is used in which the Norton equivalent conductance $G_{eq}$ and current $I_{eq}$ of the linear network at the interface port are approximated from boundary conditions defined by the nodal voltages and branch currents of the corresponding nonlinear cell of previous iterations. Hence, the nonlinear cell nodal voltages $V_1$, $V_2$ and branch currents $I_1$, $I_2$ of two previous Newton-Raphson iterations have the following relation, $$\begin{cases} \hat{V}_1 = (I_{eq} + \hat{I}_1)/G_{eq} \\ \hat{V}_2 = (I_{eq} + \hat{I}_2)/G_{eq} \end{cases} \qquad (4)$$

The Norton equivalent circuit model $G_{eq}$ and $I_{eq}$ are then obtained by solving the above equation as below:

$$\begin{cases} G_{eq} = \frac{\hat{I}_2 - \hat{I}_1}{\hat{V}_2 - \hat{V}_1} \\ I_{eq} = G_{eq}\hat{V}_2 - \hat{I}_2 \end{cases} \qquad (5)$$

Figure 5:
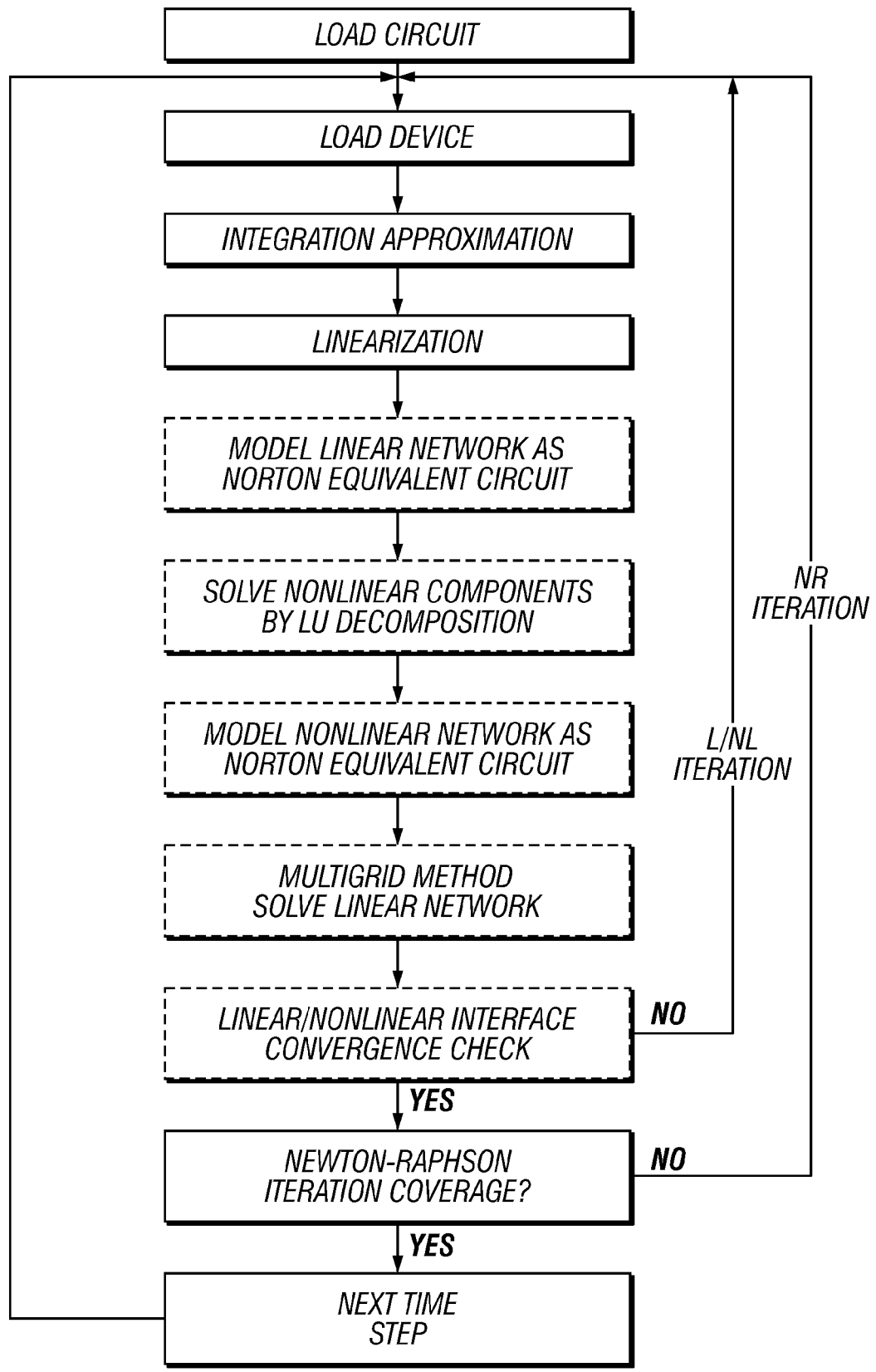
FIG. 5 illustrates one example of the processing steps in implementing the two-stage Newton-Raphson procedure.

FIG. 5 illustrates the flow of overall transient analysis based on the above simulation process. First, a circuit under analysis is represented by a computer-recognizable file and this circuit file is read by the computer in the "load circuit" step. Next at the "load device" step, the circuit file with all of its circuit devices is converted into a matrix form. At the "integration approximation" step, the differential circuit equations are approximated into sums of over time steps without time integrals. Each circuit device with a nonlinear behavior (e.g., a nonlinear I-V response) is linearized. After the integration approximation and Newton-Raphson linearization, the linear networks and nonlinear components are solved separately. First, the linear networks are modeled as equivalent Norton circuits at the linear-nonlinear interface and nonlinear components are solved by the LU decomposition method with those boundary conditions. Next, all nonlinear components are modeled with respective Norton equivalent circuits and the linear networks are solved using the adaptive algebraic multigrid method. This linear-nonlinear iteration continues until the difference of interface port nodal voltages calculated from linear and nonlinear stages is smaller than the error tolerance at every interface port.

Hence, two iterations are performed in the process in FIG. 5. The first iteration is performed for the convergence at each linear-nonlinear interface which requires the boundary voltages calculated from two stages to be the same. The entire process iterates until the convergence is achieved. The second iteration is the iteration under the Newton-Raphson algorithm.

The convergence conditions for the two-stage Newton-Raphson algorithm can be derived as follows. Nodes in the circuit networks are classified into three different kinds of nodes. The internal nodes of linear networks are defined as linear nodes, the internal nodes of nonlinear cells are defined as non-linear nodes and the nodes connecting linear and non-linear components are defined as interface nodes.

Based on the above classification of nodes, the linearized circuit equation according to the order of groups of the nodes can be expressed as follows:

$$\begin{bmatrix} G_1 & G_b & 0 \\ B_g & B_1+B_n & B_m \\ 0 & M_b & M \end{bmatrix} \begin{bmatrix} V_g \\ V_b \\ V_m \end{bmatrix} = \begin{bmatrix} b_g \\ b_b \\ b_m \end{bmatrix} \quad (6)$$

where the subscripts g, b, and m refer to linear nodes, interface nodes, and nonlinear nodes, respectively. Submatrices $G_1$, and M are Jacobian matrices corresponding to the linear nodes and nonlinear nodes. The submatrix $B_1$ denotes the Jacobian matrix contributed by linear circuits at the interface nodes. The submatrix $B_n$ denotes the Jacobian matrix by nonlinear circuits at the interface nodes. Submatrices $B_g$, $G_b$, $M_b$ and $B_m$ represent the linearized relations between node groups. Vectors Vg, $V_b$, $V_m$ are nodal voltages of linear nodes, interface nodes and nonlinear nodes, respectively. Vectors $b_g$, $b_b$, $b_m$ denote the corresponding currents at linear nodes, interface nodes and nonlinear nodes, respectively.

Figure 6A:
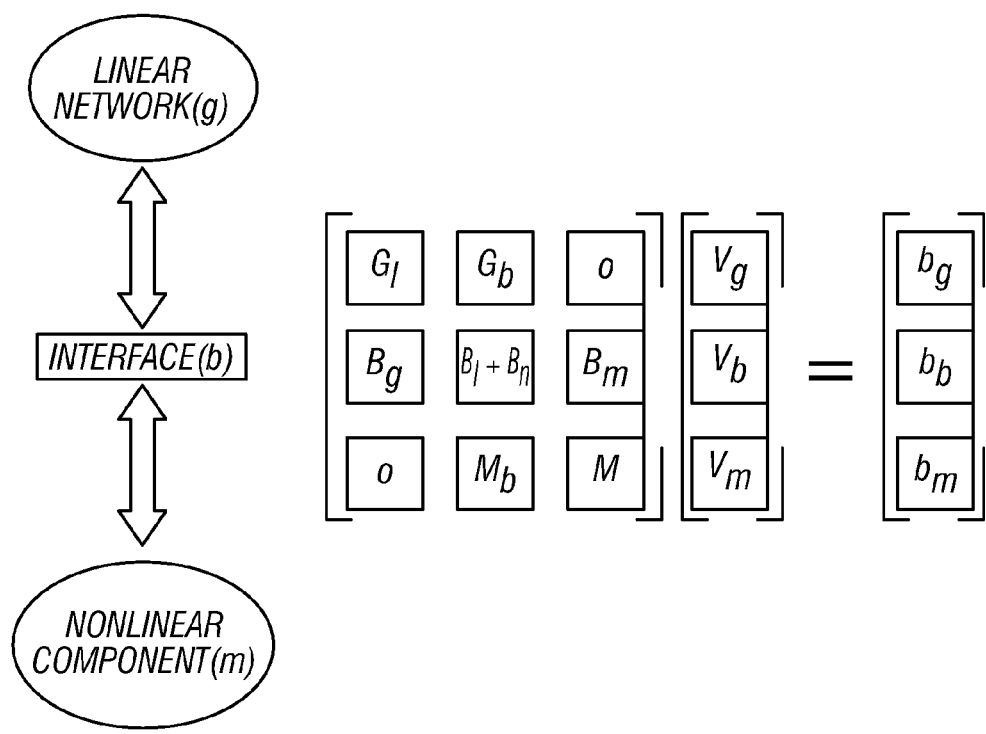
FIGS. 6A, 6B and 6C illustrate the equivalent circuit block diagrams and corresponding circuit matrix equations for linear nodes, nonlinear nodes and interface nodes.

FIG. 6A illustrates the equivalent circuit diagram for the above classification of nodes.

The two-stage Newton-Raphson approach is described by iterative equations, $$\begin{cases} \begin{bmatrix} G_1 & G_b \\ B_g & B_1+D_1 \end{bmatrix} = \begin{bmatrix} V_g^{k+1} \\ V_b^{k+\frac{1}{2}} \end{bmatrix} = \begin{bmatrix} b_g \\ b_{b1} \end{bmatrix} \\ \begin{bmatrix} B_m+D_2 & B_m \\ M_b & M \end{bmatrix} \begin{bmatrix} V_b^{k+1} \\ V_m^{k+1} \end{bmatrix} = \begin{bmatrix} b_{b2} \\ b_m \end{bmatrix} \end{cases} \quad k=0,1,2\ldots \quad (7)$$

where $b_{b1} = b_b - B_m M^{-1} b_m - N_1 V_b^k$, $b_{b2} = b_b - B_g G_1^{-1} b_g - N_2 V_b^{k+1/2}$, $D_1 = Diag(B_n - B_m M^{-1} M_b)$, $N_1 = B_n - B_m M^{-1} M_b - D_1$, $D_2 = Diag(B_1 - B_g G_1^{-1} G_b)$ and $N_2 = B_1 - B_g G_1^{-1} G_b - D_2$.

Figure 6B:
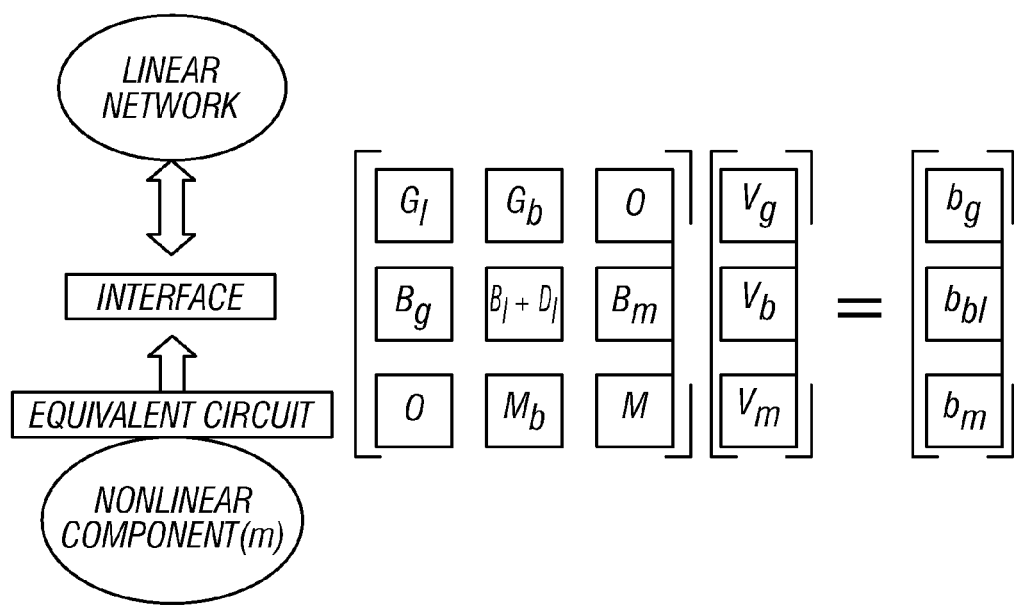
Figure 6C:
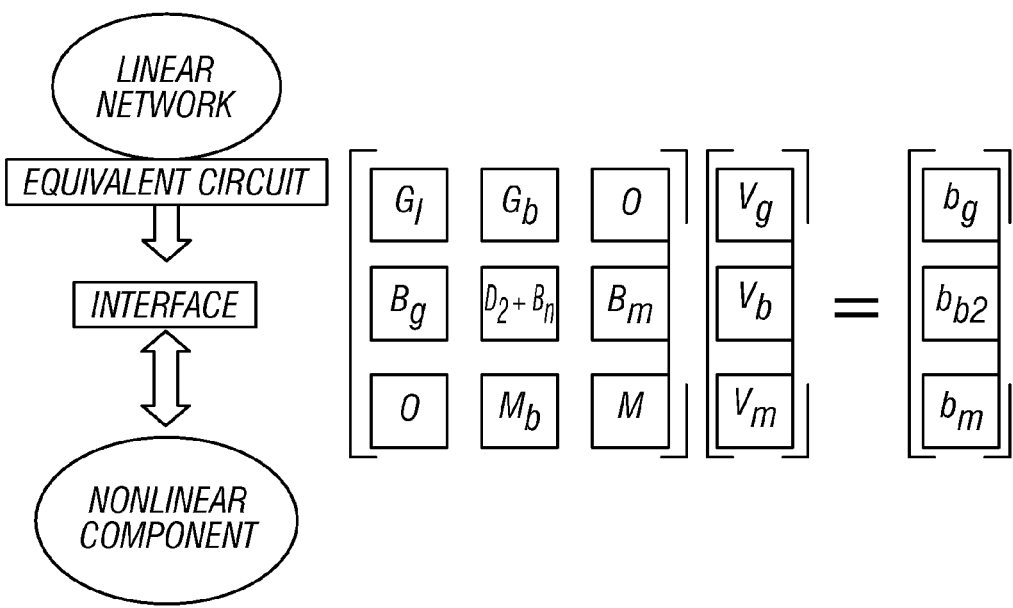

FIGS. 6B and 6C further illustrate the equivalent circuit diagrams for equivalent circuits for the nonlinear nodes and linear nodes, respectively.

The convergence condition for the above iteration equations in Eq. (7) is as follows: the two-stage Newton-Raphson approach converges if $\|E_2^{-1} N_2 E_1^{-1} N_1\| < 1$ where $E_1 = B_n + D_2 - B_m M^{-1} M_b$ and $E_2 = B_1 + D_1 - B_g G_1^{-1} G_b$.

Referring to FIGS. 1 and 5, the equivalent linear network for the original circuit can be solved by a linear circuit simulation method. For example, various linear circuit simulations based on multigrids can be used. The basic idea of a multigrid method is to map the hard-to-damp low frequency error at fine level to easy-to-damp high frequency error at coarse level, solve the mapped problem at coarse level, and then map the error correction of coarse level back to fine level. A hierarchical grid structure with multiple levels is constructed to perform such multigrid computations. At each level, a forward iterative smoothing operator such as Gauss-Seidel erases high frequency errors. There are two kinds of multigrid methods: the geometric multigrid and the algebraic multigrid (AMG).

The network analysis methods described here are based on algebraic multigrid (AMG) methods described by W. L. Briggs in "A Multigrid Tutorial", SIAM 2000 and the Web site at http://www.llnl.gov/casc/people/henson/mgtut/ps/mgtut.pdf. The AMG is a multigrid method and is an efficient technique for solving partial differential equations. The geometric multigrid method generally requires regular mesh structures. AMG does not require a regular mesh structure and can apply to other non-regular structures. In at least this regard, the AMG is a good alternative to the geometric multigrid method. The coarsening and interpolation operations of the AMG are based on the matrix itself. This overhead may make the AMG less efficient than the geometric multigrid method if the problem analyzed has a regular mesh structure. One type of the AGM methods is the adaptive algebraic multigrid approach as disclosed PCT Publication No. WO2004109452A3 for accurate analysis of the linear network at a high processing speed.

One implementation of the adaptive algebraic multigrid approach, for example, includes representing the linear circuit network by using two or more levels of grids with different numbers of nodes to represent the circuit network, applying a restriction mapping from one level to a next coarser level to propagate computation results of the one level to the next coarse level, and applying an interpolation mapping from one level to a next finer level to propagate computation results of the one level to the next finer level. In each level, an iterative smoothing operation is performed to obtain computation results of each level comprising states of nodes in each level. The above restriction mapping and the iterative smoothing operation from the finest level to the coarsest level and the interpolation mapping and the iterative smoothing operation from coarsest level back to the finest level are repeated for at least one time to obtain a solution to the circuit network.

Another implementation of the adaptive algebraic multigrid approach may include the following steps. An algebraic multigrid method is applied to a matrix representative of the linear circuit network to construct matrices with different degrees of coarsening grids. The regions in the circuit network with active circuit activities are represented by active grids and regions in the circuit network with less active circuit activities are represented by inactive grids. An iterative smoothing operation is then applied to an active grid more frequently than an inactive grid to reduce an amount of computation.

In yet another implementation of the adaptive algebraic multigrid approach, the linear circuit network is first represented by a matrix of nodes having fine nodes and coarse nodes. An adaptive coarse grid construction procedure is applied to assign grid nodes in the matrix as either coarse grid nodes or fine grid nodes. This assignment is made according to (1) circuit activities and (2) a matrix structure of the matrix. Next, iterative smoothing operations are applied at selected local fine grids corresponding to active regions at a finest level obtained in the adaptive coarse grid construction procedure.

The adaptive algebraic multigrid approach can include the contribution of the inductance of the circuit networks in addition to the effect of the resistance of the network to provide an accurate analysis of the circuit behavior. This is because the effect of the circuit inductance can become comparable with the contribution of the resistance when the signal frequency increases beyond a certain level. The adaptive features in the grid coarsening and the error smoothing operations in the adaptive algebraic multigrid approach can significantly improve the processing speed.

In implementations, the above described techniques and their variations may be implemented as computer software instructions. Such software instructions may be stored in an article with one or more machine-readable storage media that are not connected to a computer, or stored in one or more machine-readable storage devices connected to one or more computers either directly or via a communication link. In operation, the instructions are executed by, e.g., one or more computer processors, to cause the machine to perform the described functions and operations for circuit analysis.

The above two-stage Newton-Raphson approach may be implemented as computer software instructions in C or the programming languages. Tests were conducted to illustrate performance of the two-stage Newton-Raphson approach using the C programming language. In the tests, the schemes of dynamic time step size control and integration approximation were based on the same schemes used in the Berkeley SPICE3f5. The Berkeley BSIM3 was used for the transistor model in all test cases. The linear networks were solved by the adaptive multigrid method. Four industry designs were tested on a Linux machine with 2.6 GHz CPU and 4 Gigabytes memory.

Figure 7A:
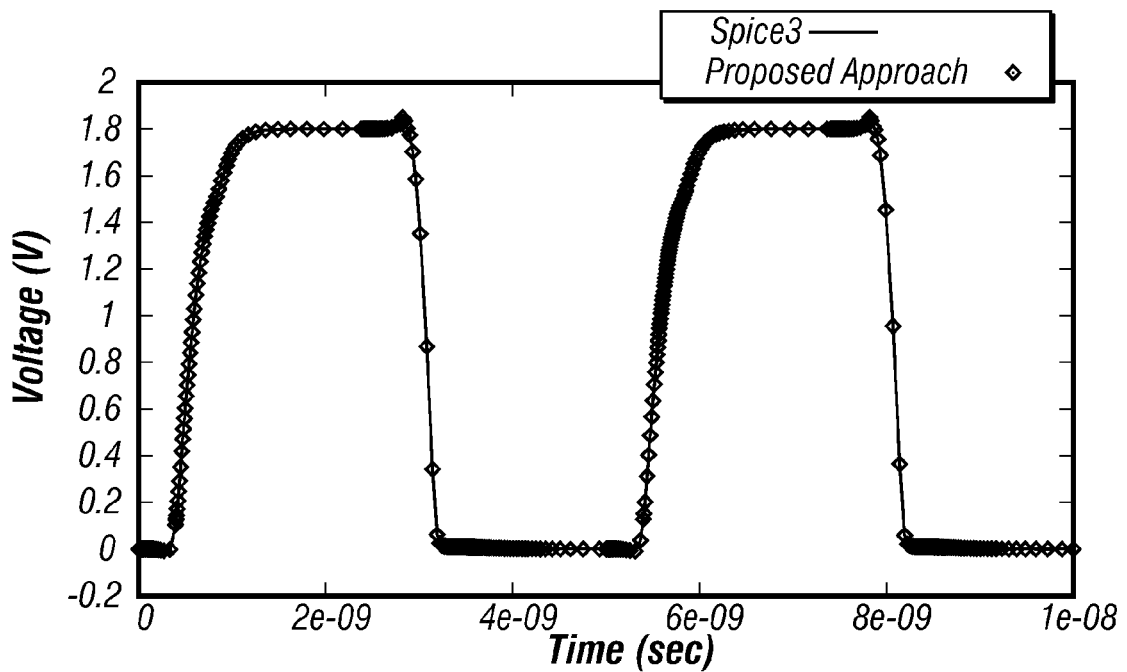
FIGS. 7A, 7B, 8A and 8B show test results in simulating exemplary circuits using the two-stage Newton-Raphson approach based on the C programming language.

A P/G network used in the tests contained an power ground network and a two-level H-tree clock. The circuit had 5400 inductors and 43700 mutual inductors. Coupling capacitors linked between power, ground and clock networks. FIG. 7A shows the waveform of one node on the clock. Transient simulation of 10 ns was completed in 1859 seconds, which is more than 20 times faster than SPICE3 as shown in Table I.

TABLE I

TRANSIENT SIMULATION RUNTIME

| Examples | P/G Network | 1K-cell | 10K-cell | IO |
|---|---|---|---|---|
| #Nodes | 29,100 | 10,200 | 123,600 | 1,062,000 |
| #Transistors | 720 | 6,500 | 69,000 | 56,600 |
| Simulation Period | 10 ns | 20 ns | 20 ns | 20 ns |
| SPICE3(sec) | 41323 | 2121 | 44293 | N/A |
| Proposed Method(sec) | 1859 | 261 | 3572 | 15337 |
| Speedup | 22.2 | 8.1 | 12.4 | N/A | where transistor devices are dominant. The 1K cell circuit had 10,200 nodes and 6,500 transistors. The 10K cell circuit had 123,600 nodes and 69,000 transistors. It is assumed that an ideal power and ground supply is provided in those RC examples. The present technique took 261 seconds for 1K cell circuit and 3572 seconds for 10K cell circuit to finish 20-ns transient simulations. The processing speed was faster than that of SPICE3 by a factor of 8.1 and 12.4 for the 1K cell and 10K cell examples, respectively (Table I). The detailed transistor device BSIM3 model evaluation time became the bottleneck for these transistor devices dominant circuits. Further increase in the processing speed can be expected if a simplified device model is used.

Figure 7B:
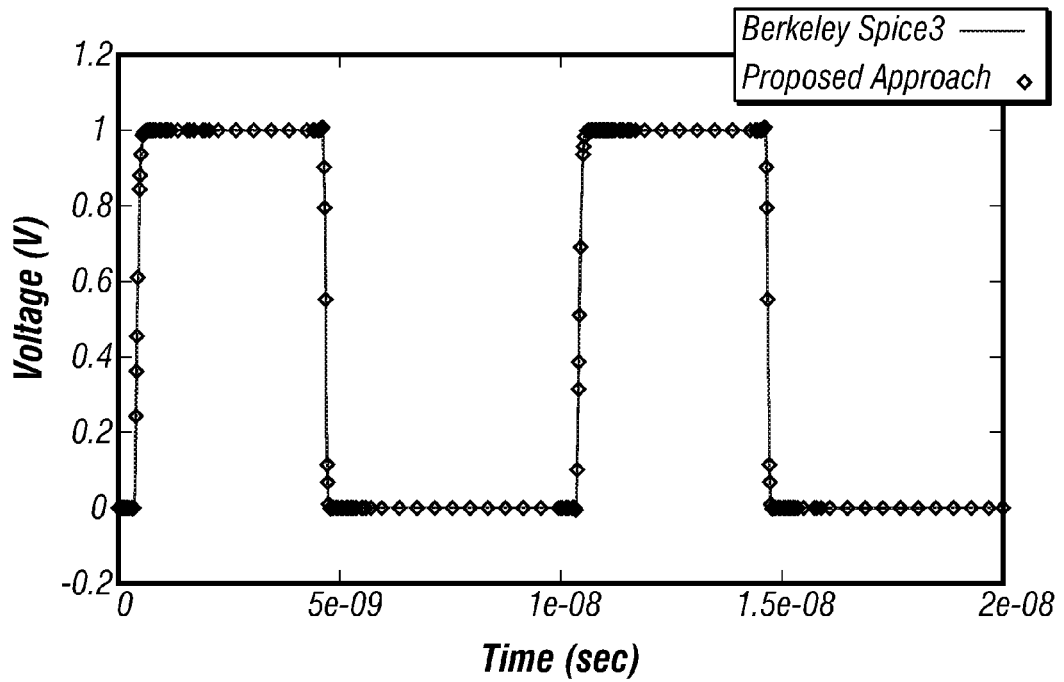

In addition, the output waveforms were thoroughly tested against the Berkeley SPICE3. An accurate match with the waveform from the Berkeley SPICE3 was observed in both examples. FIG. 7B shows the transient waveform of one gate output in the 1K cell design.

Figure 8A:
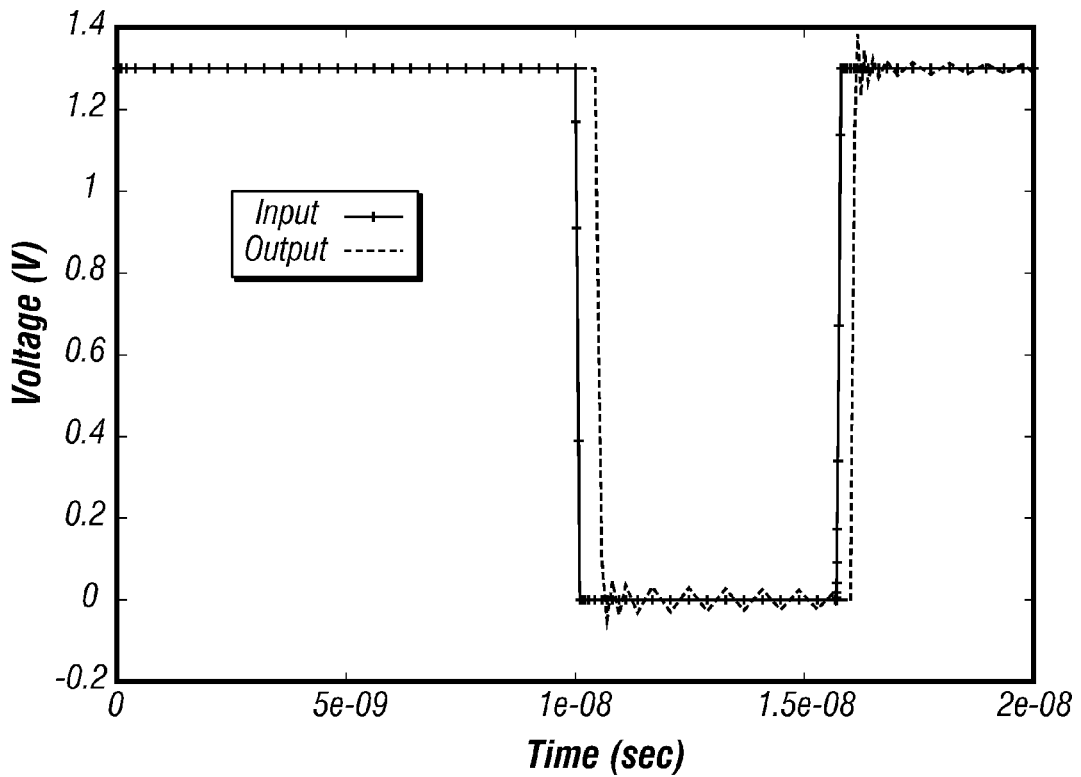
Figure 8B:
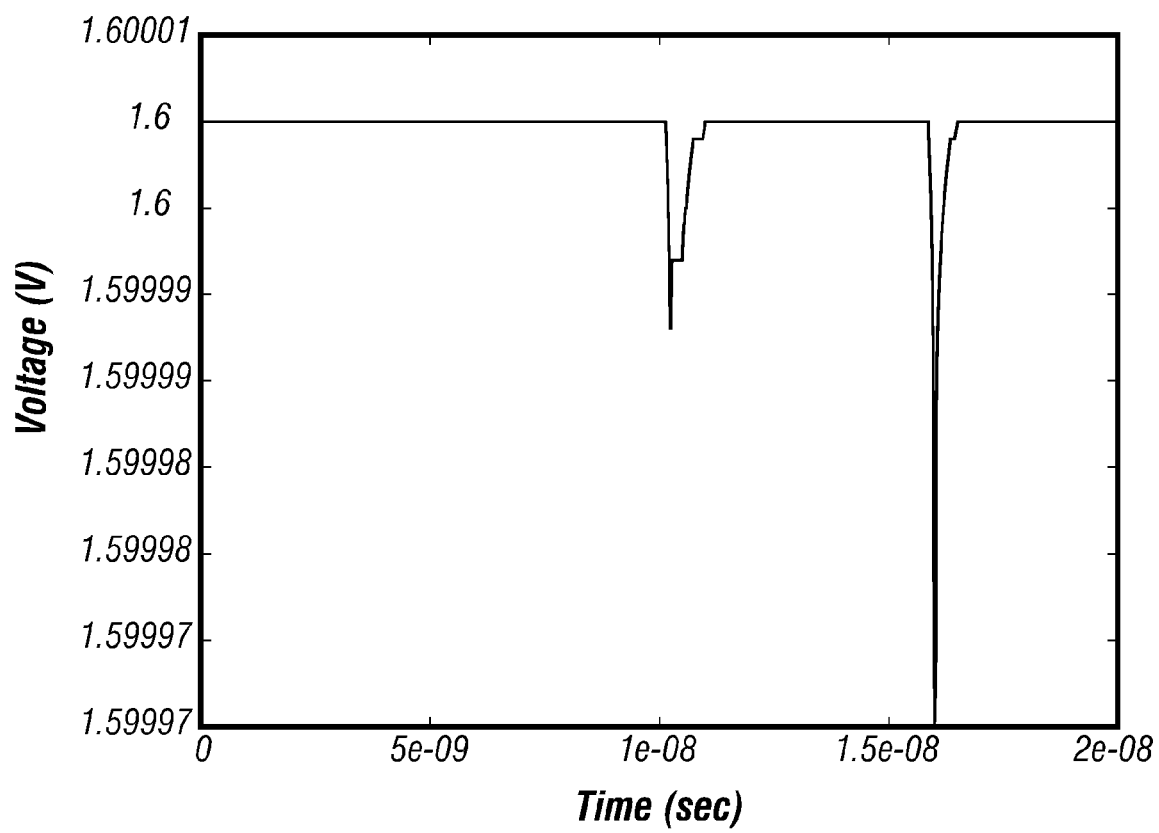

In another test, a power/ground network with IO cells was simulated. This circuit had a large power/ground network with 1 million nodes and hundreds of big IO cells (6k transistors each). Berkeley SPICE3 and HSPICE fail to execute the simulation because of the excessive requirements on the memory size and computation time. The simulation software in C based on the present technique, however, successfully finished the transient analysis of 20 ns in 4 hours. FIG. 8A shows input and output waveforms of one IO cell. FIG. 8B illustrates the voltage drop of a node on the power network.

Although only a few examples are described, other variations and enhancements can be made.

What is claimed are the techniques and systems as illustrated and described, including:

1. A computer implemented method for analyzing a circuit network having transistors, comprising:

representing, using a computer, a circuit by an equivalent circuit that comprises at least one linear network and at least one nonlinear cell to interface with each other;

solving, using the computer, circuit equations for the at least one linear network and circuit equations for the at least one nonlinear cell separately;

matching, using the computer, solutions to the circuit equations for the at least one linear network and solutions to the circuit equations for the at least one nonlinear cell at an interface between the at least one linear network and the at least one nonlinear cell via linear nonlinear iterations;

imposing, using the computer, conditions on voltages and currents in one or more internal circuit nodes in the at least one linear network, one or more nonlinear nodes in the at least one nonlinear cell, and one or more interface nodes at an interface between the at least one linear network and the at least one nonlinear cell to ensure convergence of the solutions to the at least one linear network and the at least one nonlinear cell;

repeating, using the computer, the linear nonlinear iterations until the difference in the interface node voltages calculated from linear and nonlinear stages is smaller than an error tolerance at the interface node; and identifying, using the computer, operational characteristics of the circuit network from the converged values of nodal voltages and currents.

2. The method as in claim 1, wherein solving the circuit equations for the at least one nonlinear cell comprises:

representing an interface with the at least one linear network by a first Norton equivalent circuit that is connected to the at least one nonlinear cell; and applying a lower-upper matrix (LU) decomposition to a matrix representing the circuit equations for the at least one nonlinear cell under a boundary condition and the circuit equations for the first Norton equivalent circuit to find a solution to the circuit equations for the at least one nonlinear cell.

3. The method as in claim 1, wherein solving the circuit equations for the at least one linear network comprises:

representing an interface with the at least one nonlinear cell by a second Norton equivalent circuit that is connected to the at least one linear network; and applying a linear circuit solver to the circuit equations for the at least one linear network under a boundary condition and the circuit equations for the second Norton equivalent circuit to find a solution to the circuit equations for the at least one linear network.

4. The method as in claim 3, wherein the linear circuit solver is an adaptive algebraic multigrid linear solver.

5. The method as in claim 4, wherein the multigrid linear solver uses a geometric multigrid.

6. The method as in claim 4, wherein the multigrid linear solver uses an algebraic multigrid.

7. The method as in claim 6, wherein the multigrid linear solver is to
represent the at least one linear network by using a matrix of nodes having fine nodes and coarse nodes;
apply an adaptive coarse grid construction procedure to assign grid nodes in the matrix as either coarse grid nodes or fine grid nodes according to (1) circuit activities and (2) a matrix structure of the matrix to construct a plurality of levels of grids with different numbers of nodes to respectively represent the linear network; and
apply iterative smoothing operations at selected local fine grids corresponding to active regions at a finest level obtained in the adaptive coarse grid construction procedure.

8. The method as in claim 6, wherein the multigrid linear solver is to
apply an algebraic multigrid method to a matrix representative of the at least one linear network to construct a plurality of matrices with different degrees of coarsening grids;
represent regions in the linear network exhibiting active circuit activities with active grids and regions in the linear network exhibiting less active circuit activities with inactive grids; and
perform an iterative smoothing operation in an active grid more frequently than in an inactive grid to reduce an amount of computation.

9. The method as in claim 1, wherein the operational characteristics comprises at least one of voltage drop, voltage oscillation, and electromigration.

10. A computer implemented method for analyzing a circuit network having transistors, comprising:
representing, using a computer, a circuit by an equivalent circuit that comprises at least one linear network and at least one nonlinear cell to interface with each other;
representing, using the computer, an interface between the at least one linear network and the at least one nonlinear cell by a Norton equivalent circuit;
solving, using the computer, circuit equations for the at least one linear network and the at least one nonlinear cell using a Newton-Raphson iteration;
matching, using the computer, solutions to the at least one linear network and the at least one nonlinear cell at the interface between the at least one linear network and the at least one nonlinear cell via linear nonlinear iterations;
imposing, using the computer, conditions on voltages and currents in one or more internal circuit nodes in the at least one linear network, one or more nonlinear nodes in the at least one nonlinear cell, and one or more interface nodes at an interface between the at least one linear network and the at least one nonlinear cell to ensure convergence of the solutions to the at least one linear network and the at least one nonlinear cell;
repeating, using the computer, the linear nonlinear iterations until the difference in the interface node voltages calculated from linear and nonlinear stages is smaller than an error tolerance at the interface node; and
identifying, using the computer, operational characteristics of the circuit network from the converged values of nodal voltages and currents.

11. The method as in claim 10, wherein solving the at least one nonlinear cell comprises:
applying a LU decomposition to the at least one nonlinear cell.

12. The method as in claim 10, wherein solving the at least one linear network comprises:
applying a linear circuit solver to the at least one linear network.

13. The method as in claim 12, wherein the linear circuit solver is a multigrid linear solver.

14. The method as in claim 13, wherein the multigrid linear solver uses a geometric multigrid.

15. The method as in claim 13, wherein the multigrid linear solver uses an algebraic multigrid.

16. The method as in claim 10, wherein the operational characteristics comprises at least one of voltage drop, voltage oscillation, and electromigration.

17. A machine-readable medium that stores machine-executable instructions, which when executed by a computer perform a method for analyzing a circuit network having transistors, the medium comprising instructions for:
representing a circuit by an equivalent circuit that comprises at least one linear network and at least one nonlinear cell to interface with each other;
solving circuit equations for the at least one linear network and circuit equations for the at least one nonlinear cell separately;
matching solutions to the circuit equations for the at least one linear network and solutions to the circuit equations for the at least one nonlinear cell at an interface between the at least one linear network and the at least one nonlinear cell via linear nonlinear iterations;
imposing conditions on voltages and currents in one or more internal circuit nodes in the at least one linear network, one or more nonlinear nodes in the at least one nonlinear cell, and one or more interface nodes at an interface between the at least one linear network and the at least one nonlinear cell to ensure convergence of the solutions to the at least one linear network and the at least one nonlinear cell;
repeating the linear nonlinear iterations until the difference in the interface node voltages calculated from linear and nonlinear stages is smaller than an error tolerance at the interface node; and
identifying operational characteristics of the circuit network from the converged values of nodal voltages and currents.

18. The medium as in claim 17, further comprising instructions for:
representing an interface with the at least one linear network by a first Norton equivalent circuit that is connected to the at least one nonlinear cell; and
applying a LU decomposition to the at least one nonlinear cell under a boundary condition with the first Norton equivalent circuit to find a solution to the at least one nonlinear cell.

19. The medium as in claim 17, further comprising instructions for:
representing an interface with the at least one nonlinear cell by a second Norton equivalent circuit that is connected to the at least one linear network; and
applying a linear circuit solver to the circuit equations for the at least one linear network under a boundary condition and the circuit equations for the second Norton equivalent circuit to find a solution to the circuit equations for the at least one linear network.

20. The medium as in claim 17, further comprising instructions for:
applying a multigrid linear solver to solve for the at least one linear network.

21. The medium as in claim 20, further comprising instructions for:
applying an algebraic multigrid method to a matrix representative of the at least one linear network to construct a plurality of matrices with different degrees of coarsening grids;
dividing the at least one linear network into active regions and inactive regions according to circuit activities; and
performing an iterative smoothing operation in an active region more frequently than in an inactive region.

* * * * *

UNITED STATES PATENT AND TRADEMARK OFFICE
CERTIFICATE OF CORRECTION

PATENT NO. : 7,555,416 B2  Page 1 of 1
APPLICATION NO. : 11/777211
DATED : June 30, 2009
INVENTOR(S) : Chung-Kuan Cheng and Zhengyong Zhu It is certified that error appears in the above-identified patent and that said Letters Patent is hereby corrected as shown below:

ON THE TITLE PAGE:
Item (56) (Other Publications), line 2, delete "Proceeding" and insert --Proceedings--;

Column 11, line 20 (Claim 8), after "one" delete "linear".

Signed and Sealed this

Eighteenth Day of August, 2009

David J. Kappos
*Director of the United States Patent and Trademark Office*